(12) United States Patent
Joo

(10) Patent No.: US 9,785,380 B2
(45) Date of Patent: Oct. 10, 2017

(54) SEMICONDUCTOR MEMORY DEVICE AND METHOD OF DRIVING THE SAME

(71) Applicant: SK hynix Inc., Gyeonggi-do (KR)

(72) Inventor: Byoung In Joo, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/807,694

(22) Filed: Jul. 23, 2015

(65) Prior Publication Data
US 2016/0266845 A1    Sep. 15, 2016

(30) Foreign Application Priority Data
Mar. 11, 2015    (KR) .................. 10-2015-0033802

(51) Int. Cl.
*G06F 3/06* (2006.01)
(52) U.S. Cl.
CPC .......... *G06F 3/0656* (2013.01); *G06F 3/0608* (2013.01); *G06F 3/0679* (2013.01)
(58) Field of Classification Search
CPC ..... G06F 3/0679; G06F 3/0608; G06F 3/0656
USPC .......................... 711/118, 103, 167
See application file for complete search history.

(56) References Cited

U.S. PATENT DOCUMENTS

| 8,321,765 B2* | 11/2012 | Lee ..................... G06F 11/1068 365/185.03 |
| 2008/0189478 A1 | 8/2008 | Chae et al. |
| 2009/0307415 A1* | 12/2009 | Kang ..................... G11C 7/18 711/103 |

FOREIGN PATENT DOCUMENTS

KR    10-2007-0010305    1/2007

* cited by examiner

*Primary Examiner* — Jasmine Song
(74) *Attorney, Agent, or Firm* — IP & T Group LLP

(57) ABSTRACT

Disclosed is a method of driving a semiconductor memory device, which programs first page data and second page data in a selected page of a memory cell array, the method including: transmitting a first data buffer control signal to a data buffer so that a data buffer receives the first page data; transmitting a second data buffer control signal to the data buffer so that the data buffer receives the second page data; determining a program option of the first page data; and programming the first page data and the second page data in the selected page, in which the data buffer receives at least some elements of the second page data while the determining of the program option of the first page data is performed.

18 Claims, 7 Drawing Sheets

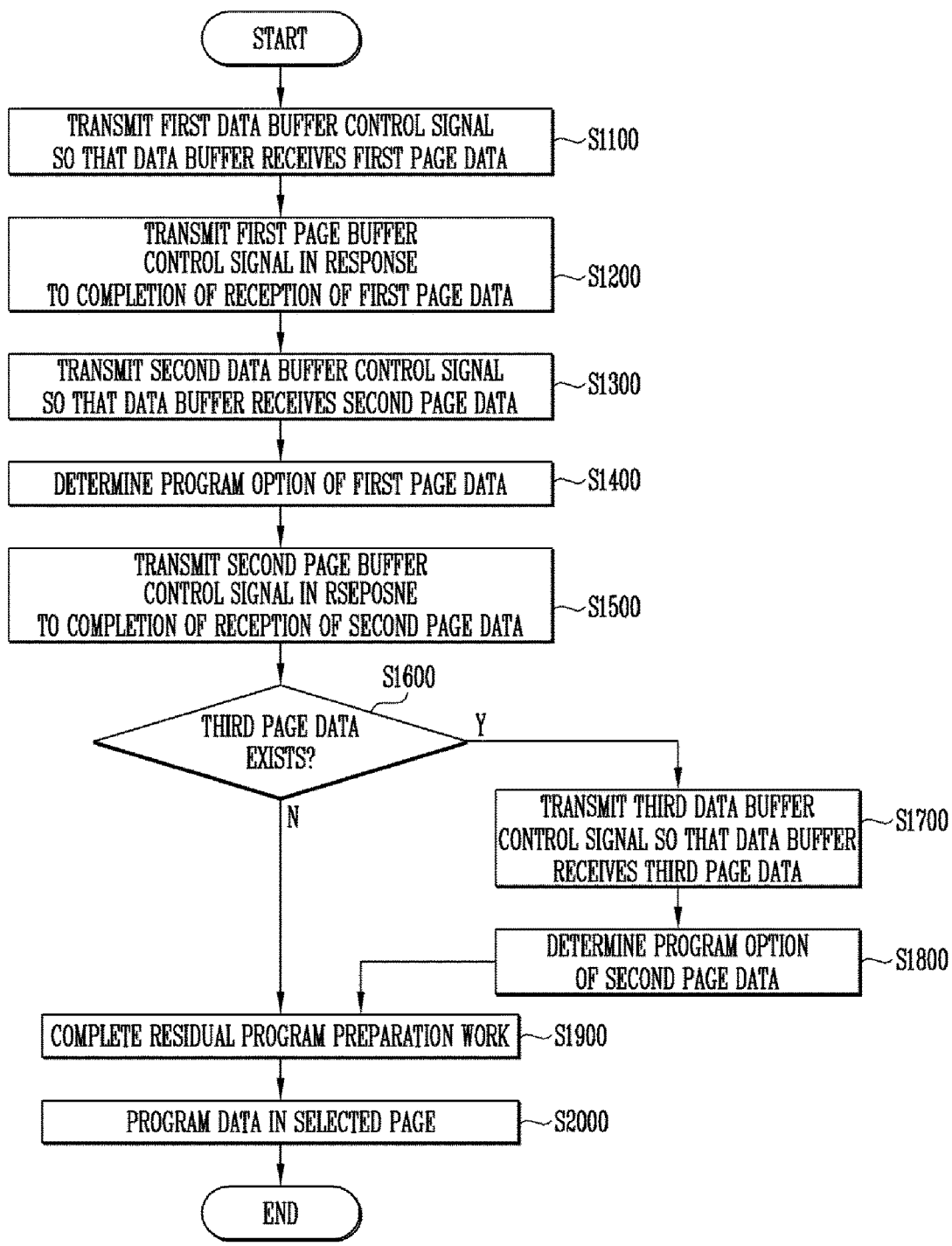

SEMICONDUCTOR MEMORY DEVICE AND METHOD OF DRIVING THE SAME

CROSS-REFERENCE TO RELATED APPLICATION

This application is based on and claims priority to Korean Patent Application No. 10-2015-0033802, filed on Mar. 11, 2015, in the Korean Intellectual Property Office, the entire disclosure of which is herein incorporated by reference in its entirety.

BACKGROUND

1. Field

The present invention relates to an electronic device, and more particularly, to a semiconductor memory device and a method of driving the same.

2. Discussion of Related Art

Instead of Hard Disk Drives (HDD), which are slow, heavy, large, and create noise due to the rotation of a physical disk, the use of semiconductor memory devices has increased.

Semiconductor memory devices are made of semiconductors such as silicon (Si), germanium (Ge), gallium arsenide (GaAs), and indium phosphide (InP). Semiconductor memory devices are generally classified into volatile memory devices and nonvolatile memory devices.

Volatile memory devices are unable to store data without a constant source of power. Examples of volatile memory devices are Static random access memory (SRAM), Dynamic RAM (DRAM), and Synchronous DRAM (SDRAM). Nonvolatile memory devices are able to maintain stored data even without a constant source of power. Examples of nonvolatile memory devices include Read Only Memory (ROM), Programmable ROM (PROM), Electrically Programmable ROM (EPROM), Electrically Erasable and Programmable ROM (EEPROM), flash memory, Phase-change RAM (PRAM), Magnetoresistive RAM (MRAM), Resistive RAM (RRAM), and Ferroelectric RAM (FRAM). Flash memory is generally divided into the NOR type and the NAND type.

To decrease cost while increasing storage capacity, research on semiconductor memory devices that can store two or more bits in one memory cell is being conducted.

When two or more bits are programmed in each memory cell within one page, program preparation work is required. A data buffer needs to receive page data, and a control logic needs to control the page data to be stored in a page buffer.

SUMMARY

The present invention has been made in an effort to provide a semiconductor memory device having reduced access time and a method of driving the same.

An exemplary embodiment of the present invention provides a method of driving a semiconductor memory device, which programs first page data and second page data in a selected page of a memory cell array, the method including: transmitting a first data buffer control signal to a data buffer so that a data buffer receives the first page data; transmitting a second data buffer control signal to the data buffer so that the data buffer receives the second page data; determining a program option of the first page data; and programming the first page data and the second page data in the selected page, wherein the data buffer receives at least some elements of the second page data while the determining of the program option of the first page data is performed.

The method may further include: transmitting a first page buffer control signal to a page buffer group in response to completely receiving the first page data after the transmitting of the first data buffer control signal; and transmitting a second page buffer control signal to the page buffer group in response to completely receiving the second page data after the transmitting of the second data buffer control signal, and wherein the determining of the program option of the first page data is performed before the transmitting of the second page buffer control signal.

The method may further include completing a residual program preparation work before the programming of the first page data and the second page data in the selected page, wherein the completing of the residual program preparation work may include: calculating a program option of the second page data; and transmitting a third page buffer control signal to the page buffer group in response to completely receiving the first page data and the second page data.

The determining of the program option of the first page data may include calculating the program option of the first page data, and when the calculating of the program option of the first page data is terminated, standing by until a reception of the second page data is completed.

The programming of the first page data and the second page data may include programming the first page data in a first bit of each memory cell of the selected page, and programming the second page data in a second bit of each memory cell of the selected page.

The method may further include: transmitting a third data buffer control signal to the data buffer so that the data buffer receives third page data after the determining of the program option of the first page data; determining a program option of the second page data; and programming the third page data in the selected page during the programming of the first page data and the second page data, wherein the data buffer may receive at least some elements of the third page data while the determining of the program option of the second page data is performed.

The determining of the program option of the second page data may include: calculating the program option of the second page data; and transmitting a third page buffer control signal to the page buffer group in response to completely receiving the first page data and the second page data.

The method may further include completing a residual program preparation work before the programming of the first page data and the second page data in the selected page, wherein the determining of the program option of the second page data may be performed before the completing of the residual program preparation work, and the completing of the residual program preparation work may include: transmitting a fourth page buffer control signal to the page buffer group in response to completely receiving the third page data; calculating a program option of the third page data; and transmitting a fifth page buffer control signal to the page buffer group in response to completely receiving of the first to third page data.

The programming of the first page data and the second page data in the selected page may include programming the first page data in a first bit of each memory cell of the selected page, programming the second page data in a second bit of each memory cell of the selected page, and programming the third page data in a third bit of each memory cell of the selected page.

Another exemplary embodiment of the present invention provides a semiconductor memory device, including: an input/output interface suitable for receiving first page data and second page data from an external device; a data buffer suitable for receiving the first page data and the second page data through the input/output interface; a page buffer group including a plurality of page buffers, and suitable for receiving the first page data and the second page data from the data buffer; a memory cell array in which the first page data and the second page data are programmed; and a control logic suitable for controlling the data buffer to receive the first page data and the second page data, and calculating a program option so that the first page data and the second page data are programmed in a selected page of the memory cell array, wherein the control logic receives a first data buffer response signal denoting the first page data has been completely received from the data buffer after transmitting a first data buffer control signal to the data buffer so that the data buffer receives the first page data, and the control logic transmits a second data buffer control signal to the data buffer in response to the first data buffer response signal so that the data buffer receives the second page data, and receives a second data buffer response signal denoting the second page data has been completely received (i.e. received in its entirety) from the data buffer, and the data buffer receives at least some elements of the second page data while the control logic calculates a program option of the first page data, and the first page data is programmed in a first bit of each memory cell of the selected page, and the second page data is programmed in a second bit of each memory cell of the selected page.

When the calculation of the program option of the first page data is completed earlier than the reception of the second page data, the control logic may stand by until the reception of the second page data is completed.

The control logic may transmit a first page buffer control signal to the page buffer group after receiving the first data buffer response signal and before transmitting the second data buffer response signal to the data buffer, transmit a second page buffer control signal to the page buffer group in response to completely receiving the second page data after receiving the second data buffer control signal, transmit a third page buffer control signal to the page buffer group in response to completely receiving the first page data and the second page data, and calculate a program option of the first page data before transmitting the second page buffer control signal to the page buffer group.

The input/output interface, the data buffer, and the page buffer group may further receive third page data, and the control logic may transmit a third data buffer control signal to the data buffer, so that the data buffer receives the third page data, and receive a third data buffer response signal corresponding to completely receiving the third page data from the data buffer, and the data buffer may receive at least some elements of the third page data while the control logic calculates a program option of the second page data, and the third page data may be programmed in a third bit of each memory cell of the selected page.

When the calculation of the program option of the second page data is completed earlier than the reception of the third page data, the control logic may stand by until the reception of the third page data is completed.

The control logic may transmit a fourth page buffer control signal to the page buffer group in response to completely receiving the third page data, transmit a fifth page buffer control signal to the page buffer group in response to completely receiving the first page data to the third page data, and the calculation of the program option of the second page data may be completed before the transmission of the fourth page buffer control signal.

The control logic may include: an interface unit suitable for transceiving a signal with the input/output interface, the data buffer, and the page buffer group; an option data storage unit suitable for receiving option data from the interface unit and storing the received option data; a program option calculation unit suitable for transmitting an option data control signal to the option data storage unit in response to an option calculation signal from the interface unit, calculating a program option based on an option data response signal corresponding to the option data control signal, and transmitting an option calculation response signal to the interface unit; and a program option storage unit suitable for storing a program option from the program option calculation unit, transmitting a program option response signal denoting the storage has been completed to the program option calculation unit, and transmitting a program option request response signal to the interface unit in response to a program option request signal of the interface unit.

An exemplary embodiment of the present invention provides a method of driving a semiconductor memory device in which a page buffer programs first page data and second page data from a data buffer to a selected page of a memory cell array under the control of a control logic, including: the data buffer receiving the first page data in response to a first data buffer control signal transmitted from the control logic; the data buffer receiving the second page data in response to a second data buffer control signal transmitted from the control logic while the control logic determines a program option of the first page data; and the page buffer programming the first page data and the second page data from the data buffer to the selected page based on the program option.

According to the exemplary embodiments of the present invention, a semiconductor memory device having reduced access time and a method of driving the same are provided.

The foregoing summary is illustrative only and is not intended to be limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 2 is a flowchart illustrating a method of driving the semiconductor memory device according to an exemplary embodiment of the present invention;

DETAILED DESCRIPTION

Figure 1A:
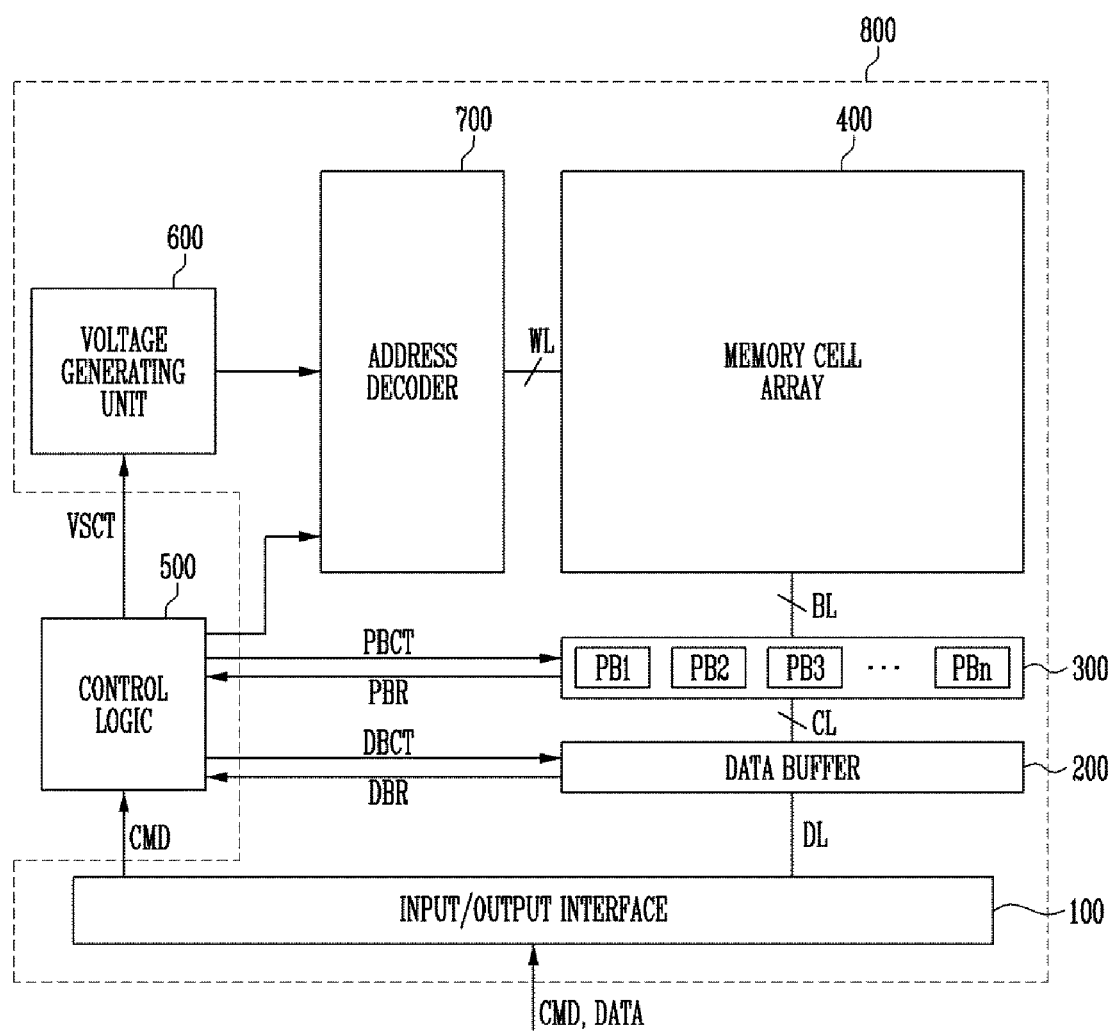
FIG. 1A is a block diagram illustrating a semiconductor memory device according to an exemplary embodiment of the present invention.

Hereinafter, exemplary embodiments of the present invention will be described in detail with reference to the accompanying drawings. Like reference numerals refer to like elements throughout the specification. In the following description, when detailed descriptions of known functions or configurations are determined to unnecessarily obscure the explanation of the present invention, they will be omitted. Further, names of constituent elements used in the description below may be selected for simplicity, and may be different from names of components of an actual product.

FIG. 1A is a block diagram illustrating a semiconductor memory device according to an exemplary embodiment of the present invention.

Referring to FIG. 1A, the semiconductor memory device according to the exemplary embodiment of the present invention includes an input/output interface 100, a data buffer 200, a page buffer group 300, a memory cell array 400, a control logic 500, a voltage generating unit 600, and an address decoder 700.

The input/output interface 100 receives data DATA and a command CMD from an external device (not shown). The command CMD may be transmitted to the control logic 500, and the data DATA may be transmitted to the data buffer 200. The data DATA may include first page data, second page data, and third page data. An I/O pad and the like may be used as the input/output interface 100.

The data buffer 200 is connected to the input/output interface 100 through a data line DL. The data buffer 200 receives data from the input/output interface 100 and stores the received data in response to a data buffer control signal DBCT outputted from the control logic 500. The stored data may be transmitted to the page buffer group 300. When the data buffer 200 completes the reception of the data, the data buffer 200 may transmit a data buffer response signal DBR to the control logic 500.

The page buffer group 300 includes a plurality of page buffers PB1, PB2, PB3, . . . , and PBn. The page buffer group 300 may be connected to the data buffer 200 through a line CL, and receive data from the data buffer 200 and store the received data in latches (not shown) in response to a page buffer control signal PBCT outputted from the control logic 500. In response to the page buffer control signal PBCT, a latch in which pre-stored data is stored, among the internal latches (not shown), may also be changed. When n elements of page data, n being a positive integer, are programmed in one page, the n elements of page data are stored in the internal latches (not shown) within the page buffer group 300. When the page buffer group 300 completes the reception of the data, the page buffer group 300 may transmit a page buffer response signal PBR to the control logic 500.

The memory cell array 400 includes a plurality of pages, each of which includes a plurality of memory cells. The memory cell array 400 is connected to the page buffer group 300 through bit lines BL, and is connected to the address decoder 700 through word lines WL. When two elements of page data are programmed in one page, the first page data may be programmed in a first bit of each memory cell of the selected page of the memory cell array 400, and the second page data may be programmed in a second bit of each memory cell of the selected page. The first bit may be a Least Significant Bit (LSB), and the second bit may be a Most Significant Bit (MSB). When three elements of page data are programmed in one page, the third page data may be additionally programmed in a third bit of each memory cell of the selected page. Here, the first bit may be an LSB, the second bit may be a Center Significant Bit (CSB), and the third bit may be an MSB. The priority of the first bit, the second bit, and the third bit may be changed. In the present specification, only examples in which two or three elements of page data are programmed in one page will be used, but four or more elements of page data may also be programmed in one page.

The control logic 500 receives a command CMD from the input/output interface 100, and calculates a program option so that two or more elements of page data are programmed in the selected page within the memory cell array 400. According to the calculated program option, a voltage level and a pulse width of a voltage supplied during a program operation and a voltage level of a voltage supplied during a verification operation may be determined. For example, when the program option is a first option, voltage levels and pulse widths of voltages supplied to the word lines to be programmed during the program operation are the same regardless of the location of the word line within the memory cell array 400. Further, voltage levels of voltages supplied to the word lines to be programmed during the verification operation are the same. However, when the program option is a second option, voltage levels and pulse widths of voltages supplied to the word lines to be programmed during the program operation may vary depending on the location of the word line within the memory cell array 400. Further, a voltage level of a voltage supplied to the word line to be programmed during the verification operation may vary depending on the location within the memory cell array 400 of the word line to be programmed. The control logic 500 transmits the data buffer control signal DBCT to the data buffer 200, and receives the data buffer response signal DBR from the data buffer 200. The data buffer control signal DBCT includes a first data buffer control signal to a third data buffer control signal so that the data buffer 200 receives the first page data to the third page data. The data buffer response signal DBR includes a first data buffer response signal to a third data buffer response signal corresponding to each of the first data buffer control signal to the third data buffer control signal.

Further, the control logic 500 transmits the page buffer control signal PBCT to the page buffer group 300, and receives the page buffer response signal PBR from the page buffer group 300. The page buffer control signal PBCT may include first to fifth page buffer control signals. Particularly, when two elements of page data are programmed in one page, the control logic 500 transmits the first page buffer control signal to the page buffer group 300 in response to the first data buffer response signal denoting the first page data has been completely received, transmits the second page buffer control signal to the page buffer group 300 in response to the second data buffer response signal denoting the second page data has been completely received, and transmits the third page buffer control signal to the page buffer group 300 in response to completely receiving the first page data and the second page data. After the transmission of the second data buffer control signal and before the transmission of the second page buffer control signal, a program option of the first page data is calculated. When three elements of page data are programmed in one page, the control logic 500 transmits the fourth page buffer control signal to the page buffer group 300 in response to the third data buffer response signal denoting the third page data has been completely received, as well as the first to third page buffer control signals, and transmits the fifth page buffer control signal to the page buffer group 300 in response to completely receiving the first page data to the third page data. After the transmission of the third data buffer control signal and before the transmission of the fourth page buffer control signal, a program option of the second page data is calculated. The page buffer response signal PBR includes a first page buffer response signal to a fifth page buffer response signal corresponding to each of the first page buffer control signal to the fifth page buffer control signal.

The control logic 500 transmits a voltage generation control signal VSCT to the voltage generating unit 600. The generation of the voltage generation control signal VSCT will be described in detail with reference to FIG. 1B. The control logic 500 may generate the voltage generation control signal VSCT to control the voltage generating unit 600, and generate and transmit an address to the address decoder 700.

The voltage generating unit 600 generates various voltages, including a program voltage and an erase voltage, used in the semiconductor memory device in response to the voltage generation control signal VSCT. Since information on the program option may be obtained from the voltage generation control signal VSCT, a voltage level and a pulse width of a voltage supplied to the word line to be programmed may be irrelevant to the location of the word line to be programmed within the memory cell array 400 when the program option is the first option. Otherwise, a voltage level and a pulse width of a voltage supplied to the word line to be programmed may be influenced by the location of the word line to be programmed within the memory cell array 400 when the program option is the second option.

The address decoder 700 receives the address from the control logic 500, and selects a page to be programmed in the memory cell array 400 based on the received address.

For convenience, parts other than the control logic 500 in the semiconductor memory device are collectively called an external control logic 800. That is, the external control logic includes an input/output interface 100, a data buffer 200, a page buffer group 300, a memory cell array 400, a voltage generating unit 600, and an address decoder 700.

Figure 1B:
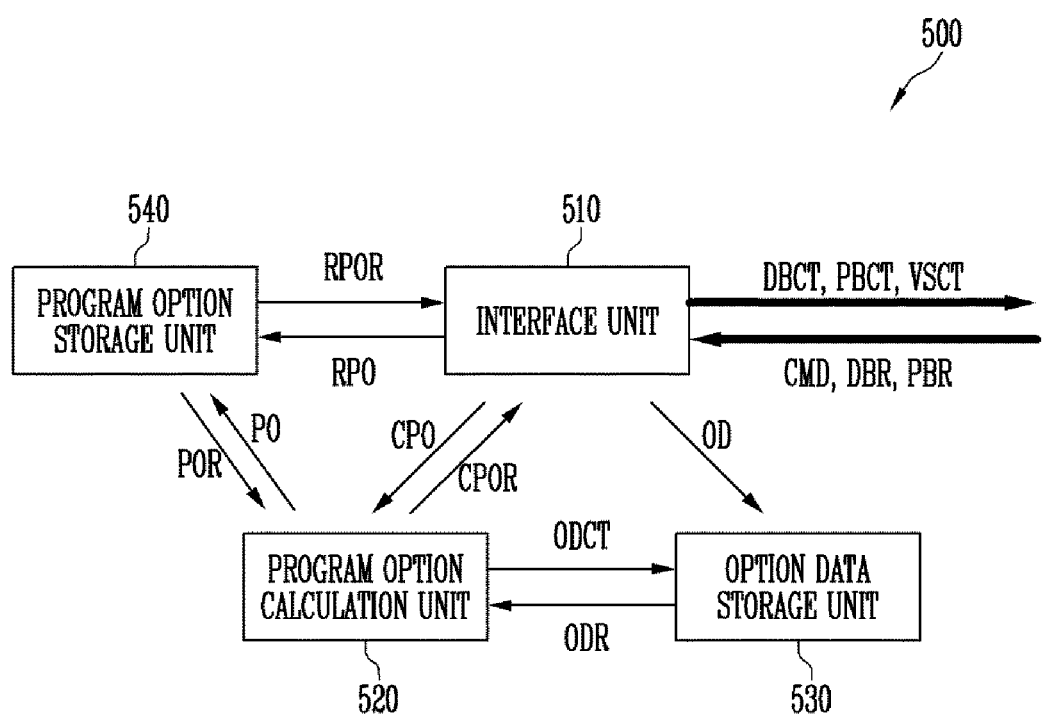
FIG. 1B is a block diagram for describing a control logic of FIG. 1A in detail.

FIG. 1B is a block diagram for describing the control logic 500 of FIG. 1A in detail.

Referring to FIG. 1B, the control logic 500 includes an interface unit 510, a program option calculation unit 520, an option data storage unit 530, and a program option storage unit 540. Hereinafter, for convenience, it is assumed that a command CMD is a program command, and data DATA includes first to third page data. The interface unit 510 transceives a signal with the external control logic 800. The interface unit 510 receives the command CMD, the data buffer response signal DBR, and the page buffer response signal PBR from the external control logic 800, and transmits the page buffer control signal DBCT, the page buffer control signal PBCT, and the voltage generation control signal VSCT to the external control logic 800. Further, the interface unit 510 transmits an option calculation signal CPO to the program option calculation unit 520, and receives an option calculation response signal CPOR from the program option calculation unit 520. The interface unit 510 transmits option data OD to the option data storage unit 530. The interface unit 510 transmits a program option request signal RPO to the program option storage unit 540, and receives a program option request response signal RPOR from the program option storage unit 540.

When the program option calculation unit 520 receives the option calculation signal CPO from the interface unit 510, the program option calculation unit 520 starts to calculate a program option. A process of calculating the program option will be described below. The program option calculation unit 520 transmits an option data control signal ODCT to the option data storage unit 530. The option data storage unit 530 transmits an option data response signal ODR corresponding to the option data OD to the program option calculation unit 520. The program option calculation unit 520 may recognize the option data OD based on the option data response signal ODR. The program option calculation unit 520 calculates a program option PO of page data, which is a target for a current calculation, based on the option data OD, and transmits the calculated program option PO to the program option storage unit 540. After the program option PO of the page data is stored in the program option storage unit 540, the program option storage unit 540 transmits a program option response signal POR to the program option calculation unit 520. In response to the program option response signal POR denoting that the program option PO of the page data, which is the target of the current calculation, is completely calculated and stored, the program option calculation unit 520 transmits the option calculation response signal CPOR to the interface unit 510.

The option data storage unit 530 receives the option data OD from the interface unit 510 and stores the received option data OD. Then, the option data storage unit 530 transmits the option data response signal ODR to the program option calculation unit 520 in response to the option data control signal ODCT from the program option calculation unit 520.

The program option storage unit 540 stores the program option PO from the program option calculation unit 520, and transmits a program option response signal POR denoting that the program option PO of the page data is completely calculated and stored therein. After the program options of all of the page data are completely calculated and stored, the program option storage unit 540 transmits the program option request response signal RPOR in response to the program option request signal RPO from the interface unit 510. The interface unit 510 generates and transmits the voltage generation control signal VSCT based on the program option request response signal RPOR to the external control logic 800.

Hereinafter, a method of driving a semiconductor memory device according to an exemplary embodiment of the present invention will be described with reference to FIGS. 1A, 1B, and 2.

FIG. 2 is a flowchart for describing a method of driving the semiconductor memory device according to an exemplary embodiment of the present invention.

Referring to FIG. 2, in operation S1100, the control logic 500 transmits a first data buffer control signal to a data buffer 200 so that the data buffer 200 receives first page data. The data buffer 200 receives the first page data in response to the first data buffer control signal. When the data buffer 200 completely receives the first page data through the data line DL, the control logic 500 receives a first data buffer response signal from the data buffer 200.

In operation S1200, the control logic 500 transmits a first page buffer control signal to the page buffer group 300 in response to the first data buffer response signal denoting the first page data has been completely received. The page buffer group 300 receives the first page buffer control signal, and stores the first page data in internal latches (not shown). When the page buffer group 300 completely receives the first page data through the data line DL, the control logic 500 receives a first page buffer response signal from the page buffer group 300.

In operation S1300, the control logic 500 transmits a second data buffer control signal to the data buffer 200 so that the data buffer 200 receives second page data. The data buffer 200 receives the second page data in response to the second data buffer control signal. When the data buffer 200 completely receives the second page data through the data line DL, the control logic 500 receives a second data buffer response signal from the data buffer 200.

In operation S1400, a program option of the first page data is determined. That is, the data buffer 200 may receive at least some elements of the second page data while the control logic 500 determines the program option of the first page data, thereby reducing the time taken for a program preparation work and the entire access time. Operation S1400 is terminated when the determination of the program option of the first page data and the reception of the second page data are completed. Detailed contents of operation S1400 will be described with reference to FIG. 3.

In operation S1500, the control logic 500 transmits a second page buffer control signal to the page buffer group 300 in response to the second data buffer response signal denoting the second page data has been completely received. The page buffer group 300 receives the second page buffer control signal, and stores the second page data in internal latches (not shown). When the page buffer group 300 completely receives the second page data through the data line DL, the control logic 500 receives a second page buffer response signal from the page buffer group 300.

In operation S1600, it is determined whether three elements of page data are programmed in the selected page. When a third page data exists, operation S1700 is performed. When it is determined that two elements of page data are programmed in the selected page, since the third page data does not exist, operation S1900 is performed.

In operation S1700, the control logic 500 transmits a third data buffer control signal to the data buffer 200 so that the data buffer 200 receives third page data. The data buffer 200 receives the third page data in response to the third data buffer control signal. When the data buffer 200 completely receives the third page data through the data line DL, the control logic 500 receives a third data buffer response signal from the data buffer 200.

In operation S1800, a program option of the second page data is determined. That is, similar to operation S1400, the data buffer 200 may receive at least some elements of the third page data while the control logic 500 determines the program option of the second page data, thereby reducing the time taken for a program preparation work and the entire access time. Operation S1800 is terminated when the determination of the program option of the second page data and the reception of the third page data are completed. A detailed explanation of operation S1800 will be described with reference to FIG. 4.

In operation S1900, the residual program preparation work is completed. Different operations are performed depending on whether two elements of page data are programmed in the selected page or three elements of page data are programmed in the selected page. Operation S1900 is terminated when all of the received page data are stored in the page buffer 300. Further, program options of all of the page data are determined when operation S1900 is terminated. Detailed contents of operation S1900 will be described with reference to FIG. 5.

In operation S2000, the program preparation work is completed so that the page data is programmed in the selected page within the memory cell array 400.

Figure 3:
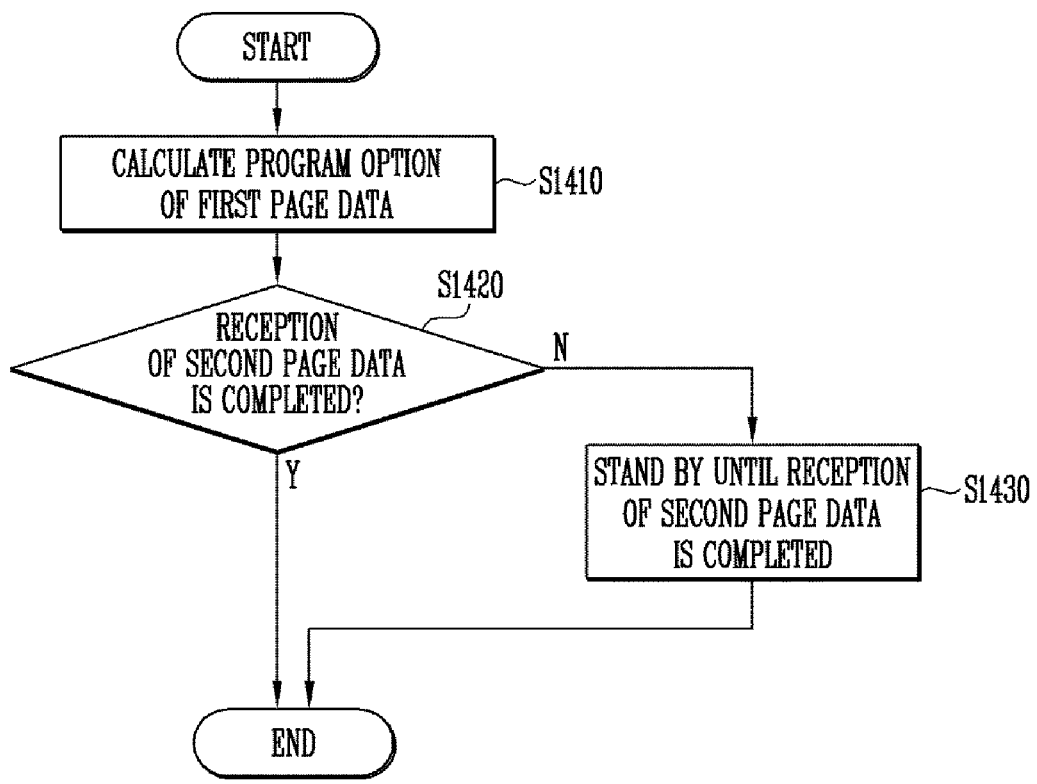
FIG. 3 is a flowchart for describing an operation of determining a program option of first page data in the method of driving the semiconductor memory device of FIG. 2.

FIG. 3 is a flowchart for describing operation S1400 of determining the program option of the first page data in the method of driving the semiconductor memory device of FIG. 2. Hereinafter, operation S1400 will be described with reference to FIGS. 1A to 3.

Referring to FIG. 3, in operation S1410, the control logic 500 calculates the program option of the first page data. As described with reference to FIG. 1B, the option calculation signal CPO, the option data control signal ODCT, the option data response signal ODR, the program option PO, the program option response POR, and the option calculation response signal CPOR may be transceived during the calculation of the program option.

In operation S1420, when the data buffer 200 completes the reception of the second page data, operation S1400 is terminated. When the data buffer 200 does not complete the reception of the second page data, operation S1430 is performed.

In operation S1430, the control logic 500 stands by until the data buffer 200 completes the reception of the second page data.

When the program option of the first page data is calculated and the reception of the second page data is completed, operation S1400 may be terminated.

Figure 4:
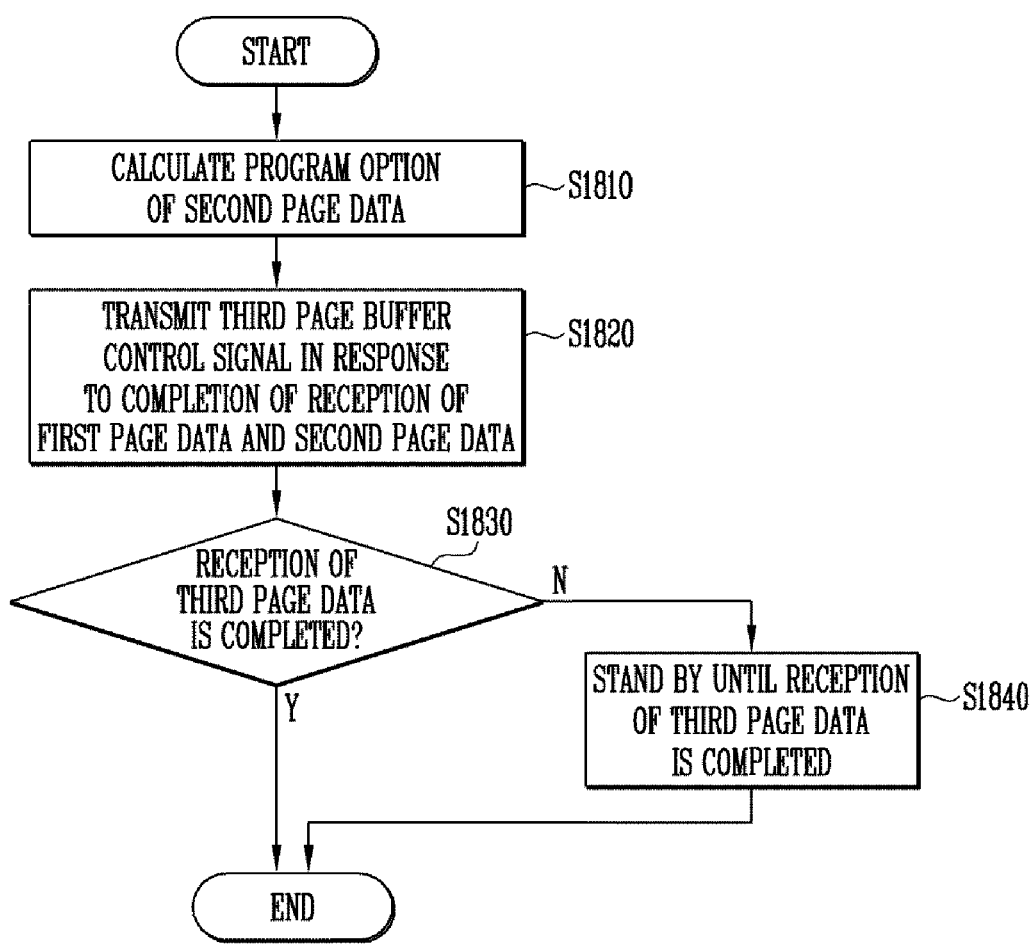
FIG. 4 is a flowchart for describing an operation of determining a program option of second page data in the method of driving the semiconductor memory device of FIG. 2.

FIG. 4 is a flowchart for describing operation S1800 of determining the program option of the second page data in the method of driving the semiconductor memory device of FIG. 2. Hereinafter, operation S1800 will be described with reference to FIGS. 1A to 4.

Referring to FIG. 4, in operation S1810, the control logic 500 calculates the program option of the second page data. Operation S1810 is similar to operation S1410, so a detailed description thereof will be omitted.

In operation S1820, the control logic 500 transmits a third page buffer control signal to the page buffer group 300 in response to completely receiving the first page data and the second page data. The page buffer group 300 receives the third page buffer control signal, and page buffers PB1 to PBn within the page buffer group 300 process the first and second page data. In operation S1820, the latches in which the first and second page data are stored, among the internal latches (not shown), may be changed in response to the third page buffer control signal. In the present specification, operation S1820 is performed after the performance of operation S1810, which is illustrative, and the order of operations S1810 and S1820 may be changed. When the page buffer group 300 completes the processing of the first and second page data, the page buffer group 300 transmits the third page buffer response signal to the control logic 500.

In operation S1830, when the data buffer 200 completes the reception of the third page data, operation S1800 is terminated. When the data buffer 200 does not complete the reception of the third page data, operation S1840 is performed.

In operation S1840, the control logic 500 stands by until the data buffer 200 completes the reception of the third page data.

When the program option of the second page data is calculated and the reception of the third page data is completed, operation S1800 may be terminated.

Figure 5:
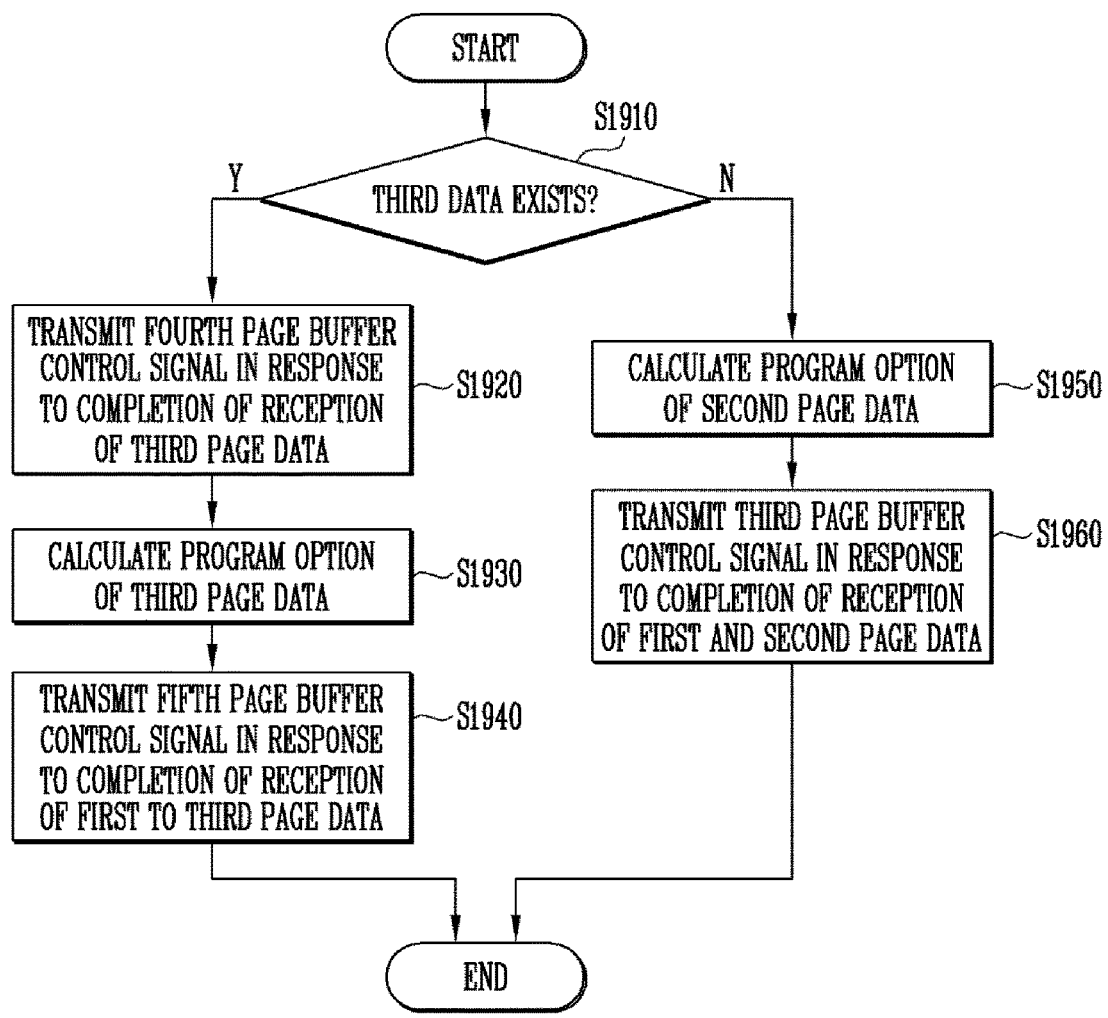
FIG. 5 is a flowchart for describing an operation of completing residual program preparation work in the method of driving the semiconductor memory device of FIG. 2.

FIG. 5 is a flowchart for describing operation S1900 of completing the residual program preparation work in the method of driving the semiconductor memory device of FIG. 2. Hereinafter, operation S1900 will be described with reference to FIGS. 1A to 5.

Referring to FIG. 5, in operation S1910, when three elements of page data are programmed in the selected page, there is third page data so that operation S1920 is performed. When two elements of page data are programmed in the selected page, the third page data does not exist so that operation S1950 is performed.

In operation S1920, the control logic 500 transmits a fourth page buffer control signal to the page buffer group 300 through the line CL in response to the third data buffer response signal denoting the third page data has been completely received. The page buffer group 300 receives the fourth page buffer control signal, and stores the third page data in internal latches (not shown) therein. When the page buffer group 300 completes the reception of the third page data, the page buffer group 300 transmits a fourth page buffer response signal to the control logic 500.

In operation S1930, the control logic 500 calculates the program option of the third page data. Operation S1930 is similar to operation S1410 and a detailed description thereof will be omitted.

In operation S1940, the control logic 500 transmits a fifth page buffer control signal to the page buffer group 300 in response to the first to third page data being completely received. The page buffer group 300 receives the fifth page buffer control signal, and the page buffers PB1 to PBn within the page buffer group 300 process the first to third page data. In operation S1940, the latches in which the first to third page data are stored, among the internal latches (not shown), may be changed in response to the fifth page buffer control signal. In the present specification, operation S1940 is performed after the performance of operation S1930, which is, however, illustrative, and the order of operations S1930 and S1940 may be changed. When the page buffer group 300 completes the processing of the first to third page data, the page buffer group 300 transmits a fifth page buffer response signal to the control logic 500.

In operation S1950, the control logic 500 calculates the program option of the second page data. Operation S1950 corresponds to operation S1810, and a detailed description thereof will be omitted.

In operation S1960, the control logic 500 transmits the third page buffer control signal to the page buffer group 300 in response to completely receiving the first page data and the second page data. Operation S1960 corresponds to operation S1820, and a detailed description thereof will be omitted. In the present specification, operation S1960 is performed after the performance of operation S1950, which is, but the order of operations S1950 and S1960 may be changed.

Figure 6:
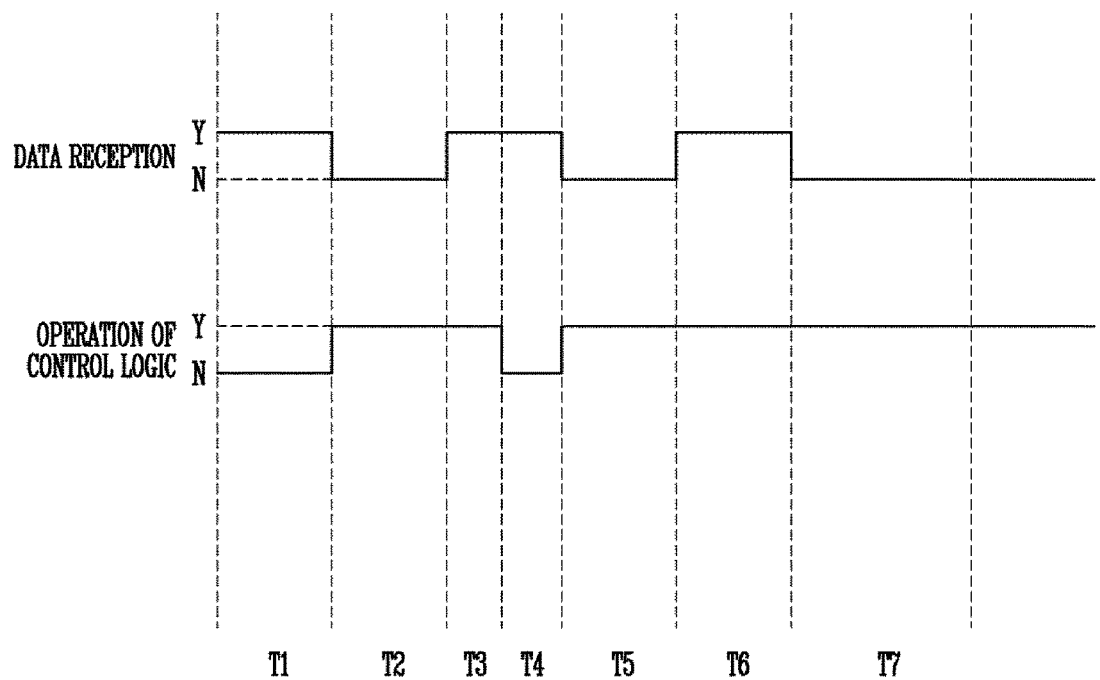
FIG. 6 is a timing chart for describing a method of driving a semiconductor memory device according to an exemplary embodiment of the present invention.

FIG. 6 is a timing chart for describing a method of driving a semiconductor memory device according to an exemplary embodiment of the present invention. FIG. 6 is a timing chart for describing where the first to third page data are programmed in a selected page of the memory cell array 400 shown in FIG. 2. Hereinafter, the method of driving the semiconductor memory device will be described with reference to FIGS. 1A to 6.

Referring to FIG. 6, the method of driving the semiconductor memory device according to the exemplary embodiment of the present invention includes first to seventh time periods T1 to T7.

When the control logic 500 transmits the first data buffer control signal to the data buffer 200, the first time period T1 starts. During the first time period T1, the data buffer 200 receives the first page data, and the control logic 500 does not operate. When the data buffer 200 completes the reception of the first page data, the first time period T1 is terminated in response to the first data buffer response signal transmitted from the data buffer 200 to the control logic 500. The first time period T1 corresponds to operation S1100.

When the control logic 500 transmits the first page buffer control signal to the page buffer group 300, the second time period T2 starts. The page buffer group 300 receives the first page buffer control signal, and stores the first page data in the internal latches (not shown) therein. During the transmission of the first page buffer control signal, the control logic 500 controls the page buffer group 300. That is, during the second time period T2, the control logic 500 operates. When the first page data is stored in the page buffer group 300, the second time period T2 is terminated in response to the first page buffer response signal transmitted from the page group 300 to the control logic 500. The second time period T2 corresponds to operation S1200.

When the control logic 500 transmits the second data buffer control signal to the data buffer 200, the third time period T3 starts. For convenience, it is assumed that the determination of the program option of the first page data is completed earlier than the reception of the second page data. During the third time period T3, the data buffer 200 receives the second page data in response to the second data buffer control signal, and simultaneously the control logic 500 determines the program option of the first page data. The control logic 500 operates for the calculation of the program option during the third time period T3. Particularly, the option calculation signal CPO, the option data control signal ODCT, the option data response signal ODR, the program option PO, the program option response POR, and the option calculation response signal CPOR may be transceived. Since the reception of the second page data by the data buffer 200 and the determination of the program option of the first page data by the control logic 500 are performed in parallel, the time taken for the program preparation work and access time may be reduced. When the calculation of the program option of the first page data is completed, the third time period T3 is terminated. The third time period T3 corresponds to operations S1300 and S1410.

The fourth time period T4 starts after the termination of the third period T3. During the fourth time period T4, the control logic 500 stands by until the data buffer 200 completes the reception of the second page data. When the data buffer 200 completes the reception of the second page data, the fourth time period T4 is terminated in response to the second data buffer response signal transmitted from the data buffer 200 to the control logic 500. The fourth time period T4 corresponds to operations S1420 and S1430. During the fourth time period T4, the control logic 500 does not operate.

When the control logic 500 transmits the second page buffer control signal to the page buffer group 300 in response to the second data buffer response signal denoting the second page data has been completely received, the fifth time period T5 starts. The page buffer group 300 receives the second page buffer control signal, and stores the second page data in internal latches (not shown). During the transmission of the second page buffer control signal, the control logic 500 controls the page buffer group 300. That is, during the fifth time period T5, the control logic 500 operates. When the second page data is stored in the page buffer group 300, the fifth time period T5 is terminated in response to the second page buffer response signal transmitted from the page group 300 to the control logic 500. The fifth time period T5 corresponds to operation S1500.

When the control logic 500 transmits the third data buffer control signal to the data buffer 200, the sixth time period T6 starts. For convenience, it is assumed that the determination of the program option of the second page data and the transmission of the third page buffer control signal are completed later than the reception of the third page data. During the sixth time period T6, the data buffer 200 receives the third page data in response to the third data buffer control signal, and simultaneously the control logic 500 determines the program option of the second page data, and transmits the third page buffer control signal in response to completely receiving the first page data and the second page data. Since the reception of the third page data by the data buffer 200, and the determination of the program option of the second page data and the transmission of the third page buffer control signal are performed in parallel, the time taken for the program preparation work may be reduced. For the sixth time period T6, the control logic 500 operates for the program calculation. The detailed description thereof is similar to the third time period T3, so it will be omitted. When the control logic 500 completes the determination of the program option of the second page data and the transmission of the third page buffer control signal, the sixth time period T6 is terminated. The sixth time period T6 corresponds to operations S1700, S1810, S1820 and S1830.

When the control logic 500 transmits the fourth page buffer control signal to the page buffer group 300 in response to the third data buffer response signal denoting the third page data has been completely received, the seventh time period T7 starts. During the seventh time period T7, the residual program work is completed, and the selected page is programmed. When the control logic 500 transmits the fourth page buffer control signal to the page buffer group 300 in response to completely receiving the third page data, the control logic 500 calculates the program option of the third page data. After the completion of the calculation, the control logic transmits the fifth page buffer control signal in response to completely receiving the first to third page data. Then, the first to third page data are programmed in the selected page within the memory cell array 400. During the seventh time period T7, the control logic 500 continuously operates. The seventh time period T7 corresponds to operations S1910, S1920, S1930, S1940, and S2000.

As described above, the embodiment has been disclosed in the drawings and the specification. The specific terms used herein are for illustration and do not limit the scope of the present invention as defined in the claims. Accordingly, those skilled in the art will appreciate that various modifications and another equivalent examples may be made without departing from the scope and spirit of the present disclosure. Therefore, the scope of the present invention should be understood as stated in the accompanying claims.

What is claimed is:

1. A method of driving a semiconductor memory device, which programs first page data and second page data in a selected page of a memory cell array, the method comprising:
    transmitting a first data buffer control signal to a data buffer so that the data buffer receives the first page data;
    transmitting a second data buffer control signal to the data buffer so that the data buffer receives the second page data;
    determining a program option of the first page data; and
    programming the first page data and the second page data in the selected page,
    wherein the data buffer receives at least some elements of the second page data while the determining of the program option of the first page data is performed,
    wherein the determining of the program option of the first page data includes:
        calculating the program option of the first page data; and
        when the calculating of the program option of the first page data is terminated, standing by until reception of the second page data is completed.

2. The method of claim 1, further comprising:
    transmitting a first page buffer control signal to a page buffer group in response to completely receiving the first page data after the transmitting of the first data buffer control signal; and
    transmitting a second page buffer control signal to the page buffer group in response to completely receiving the second page data after the transmitting of the second data buffer control signal,
    wherein the determining of the program option of the first page data is performed before the transmitting of the second page buffer control signal.

3. The method of claim 1, further comprising:
    completing residual program preparation work before the programming of the first page data and the second page data in the selected page,
    wherein the completing of residual program preparation work includes:
        calculating a program option of the second page data; and
        transmitting a third page buffer control signal to the page buffer group in response to completely receiving the first page data and the second page data.

4. The method of claim 1, wherein the programming of the first page data and the second page data includes:
    programming the first page data in a first bit of each memory cell of the selected page; and
    programming the second page data in a second bit of each memory cell of the selected page.

5. The method of claim 1, further comprising:
    transmitting a third data buffer control signal to the data buffer so that the data buffer receives third page data after the determining of the program option of the first page data;
    determining a program option of the second page data; and
    programming the third page data in the selected page during the programming of the first page data and the second page data,
    wherein the data buffer receives at least some elements of the third page data while the determining of the program option of the second page data is performed.

6. The method of claim 5, wherein the determining of the program option of the second page data includes:
    calculating the program option of the second page data; and
    transmitting a third page buffer control signal to the page buffer group in response to completely receiving the first page data and the second page data.

7. The method of claim 6, wherein the determining of the program option of the second page data further includes:
    when the calculating of the program option of the second page data and the transmitting of the third page buffer control signal are terminated, standing by until a reception of the third page data is completed.

8. The method of claim 5, further comprising:
completing residual program preparation work before the programming of the first page data and the second page data in the selected page,
wherein the determining of the program option of the second page data is performed before the completing of the residual program preparation work, and
the completing of the residual program preparation work includes:
- transmitting a fourth page buffer control signal to the page buffer group in response to completely receiving the third page data;
- calculating a program option of the third page data; and
- transmitting a fifth page buffer control signal to the page buffer group in response to completely receiving the first to third page data.

9. The method of claim 5, wherein the programming of the first page data and the second page data in the selected page includes:
programming the first page data in a first bit of each memory cell of the selected page, programming the second page data in a second bit of each memory cell of the selected page, and programming the third page data in a third bit of each memory cell of the selected page.

10. A semiconductor memory device comprising:
an input/output interface suitable for receiving first page data and second page data from an external device;
a data buffer suitable for receiving the first page data and the second page data through the input/output interface;
a page buffer group including a plurality of page buffers, and suitable for receiving the first page data and the second page data from the data buffer;
a memory cell array in which the first page data and the second page data are programmed; and
a control logic suitable for controlling the data buffer to receive the first page data and the second page data, and calculating a program option so that the first page data and the second page data are programmed in a selected page of the memory cell array,
wherein the control logic receives a first data buffer response signal denoting the first page data has been completely received from the data buffer after transmitting a first data buffer control signal to the data buffer so that the data buffer receives the first page data, and the control logic transmits a second data buffer control signal to the data buffer in response to the first data buffer response signal so that the data buffer receives the second page data, and receives a second data buffer response signal denoting that the second page data has been completely received from the data buffer, and
the data buffer receives at least some elements of the second page data while the control logic calculates a program option of the first page data, and
the first page data is programmed in a first bit of each memory cell of the selected page, and the second page data is programmed in a second bit of each memory cell of the selected page,
wherein when the calculation of the program option of the first page data is completed earlier than the reception of the second page data, the control logic stands by until the reception of the second page data is completed.

11. The semiconductor memory device of claim 10, wherein the control logic transmits a first page buffer control signal to the page buffer group after receiving the first data buffer response signal and before transmitting the second data buffer response signal to the data buffer, transmits a second page buffer control signal to the page buffer group in response to completely receiving the second page data after receiving the second data buffer control signal, transmits a third page buffer control signal to the page buffer group in response to completely receiving the first page data and the second page data, and calculates a program option of the first page data before transmitting the second page buffer control signal to the page buffer group.

12. The semiconductor memory device of claim 10, wherein the input/output interface, the data buffer, and the page buffer group further receive third page data, and
the control logic transmits a third data buffer control signal to the data buffer so that the data buffer receives the third page data, and receives a third data buffer response signal denoting the third page data has been completely received from the data buffer, and
the data buffer receives at least some elements of the third page data while the control logic calculates a program option of the second page data, and
the third page data is programmed in a third bit of each memory cell of the selected page.

13. The semiconductor memory device of claim 12, wherein when the calculation of the program option of the second page data is completed earlier than the reception of the third page data, the control logic stands by until the reception of the third page data is completed.

14. The semiconductor memory device of claim 12, wherein the control logic transmits a fourth page buffer control signal to the page buffer group in response to completely receiving the third page data, transmits a fifth page buffer control signal to the page buffer group in response to completely receiving the first page data to the third page data, and the calculation of the program option of the second page data is completed before the transmission of the fourth page buffer control signal.

15. The semiconductor memory device of claim 10, wherein the control logic includes:
an interface unit suitable for transceiving a signal with the input/output interface, the data buffer, and the page buffer group;
an option data storage unit suitable for receiving option data from the interface unit and storing the received option data;
a program option calculation unit suitable for transmitting an option data control signal to the option data storage unit in response to an option calculation signal from the interface unit, calculating a program option based on an option data response signal corresponding to the option data control signal, and transmitting an option calculation response signal to the interface unit; and
a program option storage unit suitable for storing a program option from the program option calculation unit, transmitting a program option response signal denoting the storage has been completed to the program option calculation unit, and transmitting a program option request response signal to the interface unit in response to a program option request signal of the interface unit.

16. A method of driving a semiconductor memory device in which a page buffer programs first page data and second page data from a data buffer to a selected page of a memory cell array under the control of a control logic, the method comprising:
receiving the first page data in the data buffer in response to a first data buffer control signal transmitted from the control logic;

receiving the second page data in the data buffer in response to a second data buffer control signal transmitted from the control logic while determining a program option of the first page data by the control logic; and programming the first page data and the second page data from the data buffer to the selected page based on the program option, wherein the determining of the program option of the first page data includes:

calculating the program option of the first page data; and when the calculating of the program option of the first page data is terminated, standing by until reception of the second page data is completed.

17. The method of claim 16, after determining the program option of the first page data, further comprising:

the data buffer receiving third page data in response to a third data buffer control signal transmitted from the control logic while the control logic determines a program option of the second page data, wherein the third page data is programmed in the selected page when programming the first page data and the second page data based on the program option.

18. The method of claim 16, wherein a voltage level and a pulse width of a voltage supplied during a program operation and a voltage level of a voltage supplied during a verification operation are determined based on the program option.

* * * * *